(12) United States Patent
Jung et al.

(10) Patent No.: US 6,369,181 B1
(45) Date of Patent: Apr. 9, 2002

(54) COPOLYMER RESIN, PREPARATION THEREOF, AND PHOTORESIST USING THE SAME

(75) Inventors: Min Ho Jung; Jae Chang Jung; Cheol Kyu Bok; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/222,053

(22) Filed: Dec. 29, 1998

(30) Foreign Application Priority Data

Dec. 29, 1997 (KR) .............................. 97-77412

(51) Int. Cl.[7] .......................... C08F 32/08; G03F 7/039

(52) U.S. Cl. ...................... 526/281; 526/280; 526/269; 526/271; 526/272; 430/270.1

(58) Field of Search ................................. 430/192, 176, 430/270, 284, 269; 526/271

(56) References Cited

U.S. PATENT DOCUMENTS

| | | | |
|---|---|---|---|
| 3,370,047 A | 2/1968 | Raines | 260/78.5 |
| 3,715,330 A | 2/1973 | Nogami et al. | 260/40 R |
| 4,011,386 A | 3/1977 | Matsumoto et al. | |
| 4,106,943 A | 8/1978 | Ikeda et al. | |
| 4,126,738 A | 11/1978 | Gaylord | 526/271 |
| 4,202,955 A | 5/1980 | Gaylord | 526/272 |
| 4,440,850 A | 4/1984 | Paul et al. | 430/325 |
| 4,491,628 A | 1/1985 | Ito et al. | 430/176 |
| 4,857,435 A | 8/1989 | Hopf et al. | 430/192 |
| 4,883,740 A | 11/1989 | Schwalm et al. | 430/270 |

(List continued on next page.)

FOREIGN PATENT DOCUMENTS

| | | | |
|---|---|---|---|
| EP | 0071571 | 7/1982 | |
| EP | 0291970 | 11/1988 | ......... C08F/210/02 |
| EP | 0 789 278 A | 8/1997 | |
| EP | 794458 A2 | 9/1997 | ....... G03F/007/004 |
| EP | 0 794 458 A | 9/1997 | |
| EP | 0836119 A1 | 11/1997 | |
| EP | 0878738 A2 | 11/1998 | ........... G03F/7/004 |
| GB | 0768813 | 2/1957 | |
| GB | 1329997 | 9/1970 | |
| GB | 1342112 | 12/1973 | |

(List continued on next page.)

OTHER PUBLICATIONS

R.D. Allen et al., "The Influence of Photoacid Structure on the Design and Performance of 193nm Resists", 1997, Journal of Photopolymer Science and Technology, vol. 10, 503–510.

F.M. Houlihan et al., "A Commerically Viable 193nm single Layer Resist Platform", 1997, Journal of Photopolymer Science and Technology, vol. 10, 511–520.

CA Abstract No. 104:149512 & Macromolecules 19(4) 1266–8 (1986).

CA Abstract No. 91:124064 & Makromol. Chem 180(8) 1975–88 (1979).

CA Abstract No. 113:24734 & JP 02 051511.

CA Abstract No. 127:227269 & J Photopolym. Sci. Technol. 10(4) 529–534 (1997).

CA Abstract No. 124:137926 & Marcomol. Rapid Commun. 17(3) 173–180 (1996).

CA Abstract No. 124:203171 & Macromolecules 29(8) 2755–63 (1996).

CA Abstract No. 127:227308 & Proc. SPIE–Int. Soc. Opt. Eng. (1997) 3049 Advances in Resist Technology and Processing XIV 92–103.

CA Abstract No. 66:18889 & Magy. Kem. Foly. (1966) 72(11)491–3.

CA Abstract No. 199328–07–9.

CA Abstract No. 199328–07–9.

S. J. Choi et al., New ArF Single Layer Resist for 193 –nm Lithography, 1997, *Journal of Photopolymer Science and Technology*, vol. 10, 521–528.

Alexander A. Dobrev, Emile Perez, Jean Claud Ader, Armand Lattes, "First Application of Functionalized in the Ester Moiety Acrylates in Diels–Alder Reaction: Invluence of Solvents on Stereochemistry"; Bulgarian Chemical Communications, vol. 28, No. 2 (1995) pp. 253–258.

(List continued on next page.)

*Primary Examiner*—David W. Wu
*Assistant Examiner*—Tanya Zalukaeva
(74) *Attorney, Agent, or Firm*—Townsend and Townsend and Crew LLP

(57) ABSTRACT

The present invention relates to a copolymer resin for a photoresist used with far ultraviolet rays such as KrF or ArF. The copolymer is represented by the following formula III:

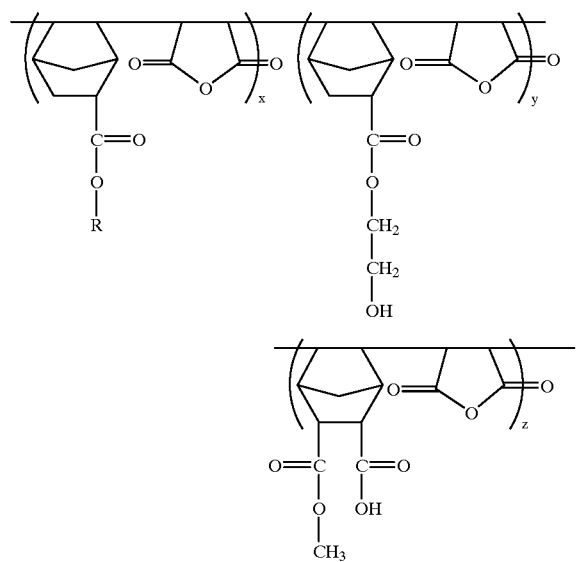

[FORMULA III]

5 Claims, No Drawings

U.S. PATENT DOCUMENTS

| | | | |
|---|---|---|---|
| 4,948,856 A | 8/1990 | Minchak et al. | 526/281 |
| 4,986,648 A | 1/1991 | Kobayashi et al. | 351/160 R |
| 5,064,919 A | 11/1991 | Hara et al. | 526/169 |
| 5,087,677 A | 2/1992 | Brekner et al. | 526/160 |
| 5,212,043 A | 5/1993 | Yamamoto et al. | |
| 5,252,427 A | 10/1993 | Bauer et al. | 430/270 |
| 5,278,214 A | 1/1994 | Moriya et al. | |
| 5,324,804 A | 6/1994 | Steinmann | 526/313 |
| 5,585,219 A | 12/1996 | Kaimoto et al. | 430/270.1 |
| 5,738,975 A | 4/1998 | Nakano et al. | 430/280.1 |
| 5,843,624 A | 12/1998 | Houlihan et al. | 430/296 |
| 5,849,808 A | 12/1998 | Schacht et al. | 522/31 |
| 6,028,153 A | 2/2000 | Jung | 526/258 |
| 6,045,967 A | 4/2000 | Jung et al. | 430/270.1 |
| 6,132,926 A * | 10/2000 | Jung et al. | 430/270.1 |
| 6,143,463 A * | 11/2000 | Jung et al. | 430/270.1 |
| 6,165,672 A * | 12/2000 | Jung et al. | 430/270 |

FOREIGN PATENT DOCUMENTS

| | | | |
|---|---|---|---|
| GB | 1484061 | 8/1977 | |
| GB | 1335095 | 10/1997 | C05G/20/00 |
| GB | 2320501 A | 12/1997 | |
| GB | 2320718 A | 12/1997 | |
| GB | 2320717 A | 7/1998 | |
| GB | 2321060 A | 7/1998 | |
| GB | 1484061 | 8/1998 | C08J/3/28 |
| GB | 2332679 A | 6/1999 | C08F/232/08 |
| GB | 2336845 A | 11/1999 | C08F/222/06 |
| GB | 2336846 A | 11/1999 | C08F/222/240 |
| JP | 05297591 | 4/1992 | |
| JP | 10316720 | 2/1998 | |
| NL | 128164 | 2/1997 | |
| WO | WO 96/37596 | 11/1996 | |
| WO | WO 97/06216 | 2/1997 | C09D/5/00 |
| WO | WO 97/33198 | 9/1997 | |
| WO | WO 98/07759 | 2/1998 | C08F/2/50 |
| WO | WO 99/14256 | 3/1999 | |

OTHER PUBLICATIONS

T.P. McGovern and C.E. Schreck, "Mosquito Repellents: Monocarboxylic Esters of Aliphatic Diols," Journal of the American Mosquito Control Association, vol. 4, No. 3, pp. 314–321.

35–Synthetic High Polymers, *Chemical Abstracts*, (1967) vol. 66, 76325, pp. 7178–7179.

CA Register No. 37503–43–8.

WPI Accession No. 94–227160[28] (FR2695540).

WPI Accession No. 90–049159[07] (JP2003404(elf)).

WPI Accession No. 99–076491 (JP10316720).

Japanese Patent Abstract 10017526.

Japanese Patent Abstract 08134015 A.

CA 121:10910 (JP 05310885).

CA 129:209337 (JP 10–218941).

CA 129:223219 (JP 10213912).

CA 1981–47831.

Uzodinma Okoroanyanwu et al., New Single Layer Positive Photoresists for 193 nm Photolithography, *SPIE*, vol. 3049, 1997, pp. 92–103.

CA 130:229879.

ACS Abstract Ref. 172992–05–1.

D. Braun and Joannis Pomakis, Uber Die Copolymerisation von Maleinsaureanhydrid Mit Bicyclo [2.2.1] Hept–5–En–2–Carbonsaure, *European Polymer Journal*, (1974) vol. 10 [4] pp. 357–365. (Abstract only in English).

J. Byers et al., Recent Advancements in Cycloolefen Based Resists for ArF Lithography, *Journal of Photopolymer Science and Technology*, (1998) vol, II No. 3, pp. 465–474.

James V. Crivello and Sang–Yeon Shim, Chemically Amplified Electron–Beam Photoresists, *Chemical Mater.*, (1966) vol. 8, pp. 376–381.

F. M. Houlihan et al. Photo Generators of Sulfamic Acids; Use in Chemically Amplified Single LAyer Resists, *Journal of Photopolymer Science and Technology* (1998) vol. 11, No. 3, pp. 419–430.

CA 1981:47831 Vesti Akad, Navuk BSSR, Ser. Khim. Navuk (1980) 5, pp. 128–30.

Evaluation of Cycloolefin–Maleic Anhydride Alternating Copolymers as Single–Layer Photoresists for 193 nm Photolithgraphy; Thomas I. Wallow, Francis M. Houlihan, Omakaram Nalamasu, Edwin A. Chandross, Thomas X. Neenan, Elsa Reichmanis, SPI vol. 2724,pp. 355–364.

ArF Single Layer Resist Composed of Alicyclic Main Chain Containing Maleic Anhydride; Jae–Chang Jung, Cheol–Kyu Bok and Ki–Ho Baik, Journal of Photopolymer Science and Technology, vol. 10, No. 4 (1997), pp. 529–534.

Synthesis and Dissolution Characteristics of Novel Alicyclic Polymers with Monoacid Ester Structures; Takashi Hattori, Yuko Tsuchiya, Ryoko Yamanaka, Keiko Hattori, and Hiroshi Shiraishi; Journal of Photopolymer Science and Technology, vol. 10, No. 4 (1977), pp. 535–544.

New Protective Groups in Alicyclic Methacrylate Polymers for 193–nm Resists; Koji Nozaki and Ei Yano; Journal of Photopolymer Science and Technology, vol. 10, No. 4 (1997), pp. 545–550.

Chemically Amplified Resist Based on High Etch–Resistant Polymers for 193–nm Lithography; Kaichiro Nakano, Katsumi Maeda, Shigeyuki Iwasas and Etsuo Hasegawa; Journal of Photopolymer Science and Technology, vol. 10, No. 4 (1997), pp. 561–570.

* cited by examiner

COPOLYMER RESIN, PREPARATION THEREOF, AND PHOTORESIST USING THE SAME

BACKGROUND OF THE INVENTION

The present invention generally relates to a copolymer resin for a photoresist used in the manufacture of electronic devices. The photoresist can be used with an ultraviolet ray such as KrF or ArF. More particularly, the present invention relates to processes for preparation of the photoresist, processes using the photoresist, and the photoresist itself. In an exemplary embodiment, the invention relates to a photoresist resin, wherein a mono-methyl cis-5-norbornene-endo-2, 3-dicarboxylate unit has been introduced to a norbornene-maleic anhydride copolymeric structure for a photoresist, usable in a lithography process using a KrF (248 nm) or ArF (193) light source which could be applied in 1 G or 4 G DRAM devices, and others; a process for preparation thereof; and a photoresist containing the same resin.

Various types of photoresists have been used or proposed. These photoresists often have a variety of characteristics or properties such as etching resistance, adhesiveness, and others. In general, etching resistance and adhesiveness with low light absorption at 193 nm wavelength are desirable for a copolymer resin for ArF. The copolymer resin also should be developable by using 2.38 wt % aqueous tetraethylammonium hydroxide (TMAH) solution. It is difficult to synthesize a copolymer resin, however, satisfying one or more of these properties. Many. researches have focused on studies on novolac-type resin as a resin to increase transparency at 193 nm wavelength and increase etching resistance. As an example, Bell Laboratories tried to introduce an alicyclic unit to the backbone chain in order to enhance etching resistance. The copolymer resin in which the backbone chain has norbornan, acrylate and maleic anhydride substituents, is, for example, represented by formula I:

[FORMULA I]

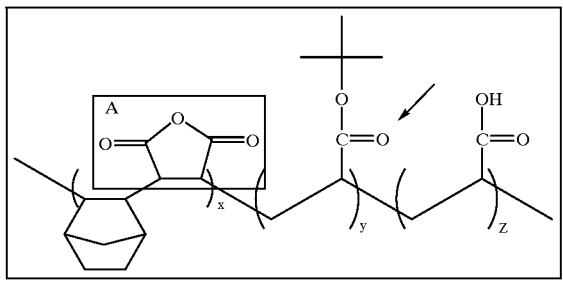

The copolymer resin of formula I, in which the maleic anhydride portion (A portion) used for polymerizing the alicyclic olefin group, however, is the only material to be polymerized with norbornene, the alicyclic unit, without absorbing ArF light having 193 nm wavelength. Accordingly, it generally cannot be used as a resin for ArF, because it is quite soluble in 2.38% aqueous TMAH solution. The solubility occurs even without exposure to create a 'top loss' phenomenon (the top of pattern being formed is in a round shape) which is generally seen in conventional photoresist patterning.

Thus, in order to prevent such phenomenon, the y-portion having a tert-butyl substituent should be increased. A relative decrease of the z-portion, which enhances sensitivity and adhesiveness with substrate, causes disadvantages in that the photoresist is removed from the wafer in conventional patterning so that the pattern cannot be formed effectively. Other resist products have been proposed, but these resist products can have numerous limitations such as difficulty in manufacturing, offensive odors, and the like.

From the above, it is seen that a photoresist having better adhesiveness and improved resolution is desired.

SUMMARY OF THE INVENTION

According to the present invention, the present inventors developed a maleic anhydride type copolymer resin comprising a 5-norbornene-2-carboxylic acid monomer represented by formula II as a main constituent, and filed a patent application (Korean Patent Application No. 97-26807 filed on Jun. 21, 1997), as an attempt to solve limitations of conventional photoresist products.

[FORMULA II]

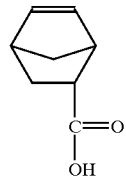

Though a photoresist using the maleic anhydride type copolymer resin suggested by the above application is a polymer resin with high adhesiveness, sensitivity and excellent resolution, there is a problem in practical manufacturing, because one of the main constituents, 5-norbornene-2-carboxylic acid may generate a very offensive odor during the synthetic process. Thus, the present inventors have developed a novel photoresist having excellent resolution without causing the problem of offensive odor.

In a specific embodiment, the present invention provides a technique for limiting the offensive odor caused by conventional resist products. More particularly, the present invention provides a method of introducing a mono-methyl cis-5-norbornene-endo-2, 3-dicarboxylate unit instead of a 5-norbornene-2-carboxylic acid unit in the norbornene-maleic anhydride copolymer structure. The present method resolves, in part, any problem of emitting an offensive odor. In a preferred embodiment, the present method provides a resulting resist without substantially deteriorating resist sensitivity. The present photoresist also has characteristics such as excellent adhesiveness and resolution (0.13 $\mu$m). The present resist can be obtained with easy control of constituent composition during the synthesis of photoresist resin to make the mass production possible.

Numerous advantages or benefits are achieved by way of the present invention over conventional techniques. In a specific embodiment, the present invention provides a copolymer resin comprising a mono-methyl cis-5-norbornene-endo-2, 3-dicarboxylate unit. In an alternative embodiment, the present invention provides a process for preparing the copolymer resin comprising a mono-methyl cis-5-norbornene-endo-2, 3-dicarboxylate unit. In still a further embodiment, the present invention provides a photoresist comprising the above norbornene-maleic anhydride copolymer resin, organic solvent, and photo acid generator. Still farther, the present invention provides a semiconductor element manufactured by using the photoresist comprising the above copolymer resin. These and other benefits are described throughout the specification and more particularly below.

DETAILED DESCRIPTION OF THE INVENTION

The present invention relates to a copolymer resin for a photoresist comprising a mono-methyl cis-5-norbornene-endo-2, 3-dicarboxylate unit, which is represented by following formula III:

[FORMULA III]

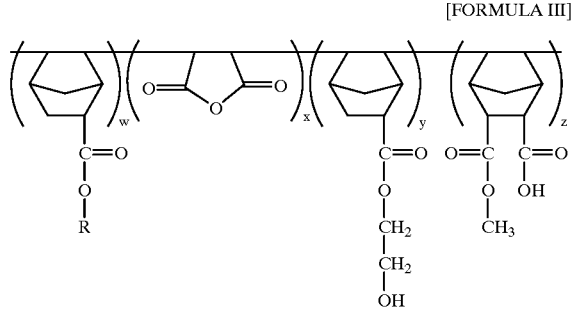

where, R represents tert-butyl, tetrahydropyranyl, tetrahydrofuranyl or ethoxyethyl group, and the ratio x:y:z is (0.1–99%):(0.1–99%):(0.1–99%).

The copolymer resins according to an embodiment of the present invention preferably include norbornene-maleic anhydride copolymer resins represented by formulas IV to VII.

[FORMULA IV]

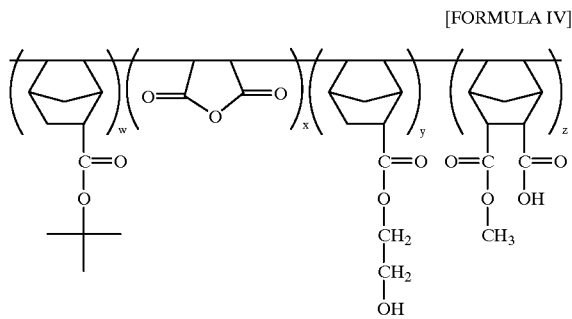

[FORMULA V]

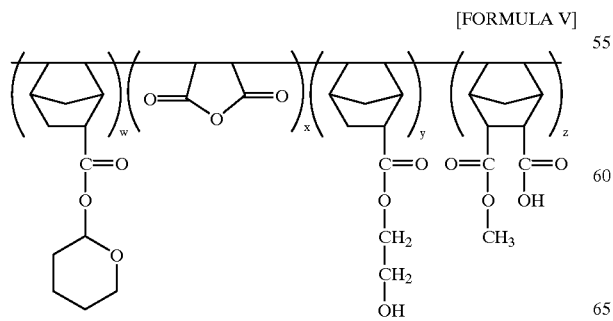

[FORMULA VI]

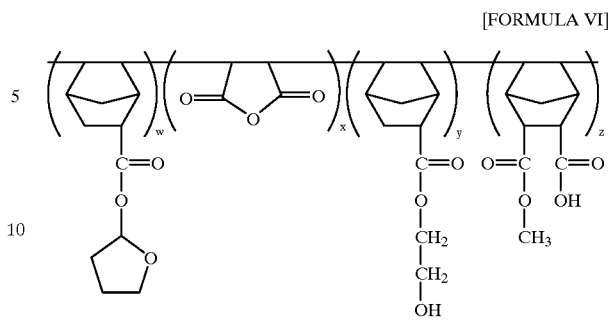

[FORMULA VII]

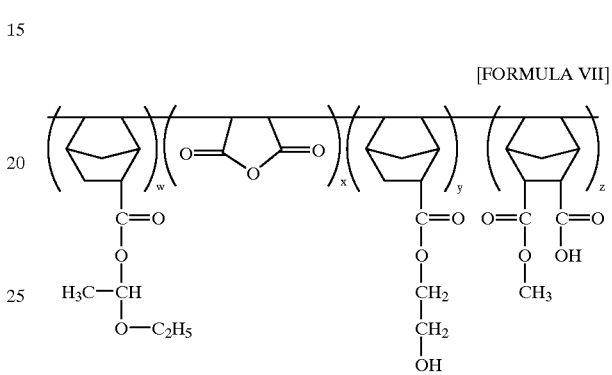

In the above formulas, R, x, y and z are defined as above.

The copolymer resin of the present invention, represented by formula III, can be prepared by polymerizing the norbornene derivative of formula VIII, 2-hydroxyethyl-5-norbornene-2-carboxylate of formula IX, maleic anhydride of formula X and mono-methyl-cis-5-norbornene-endo-2, 3-dicarboxylate of formula XI in the presence of a radical initiator.

[FORMULA VIII]

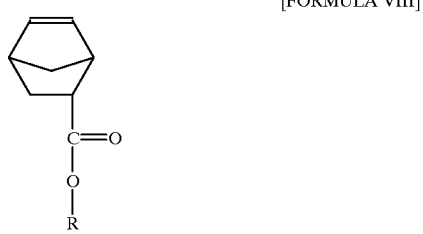

[FORMULA IX]

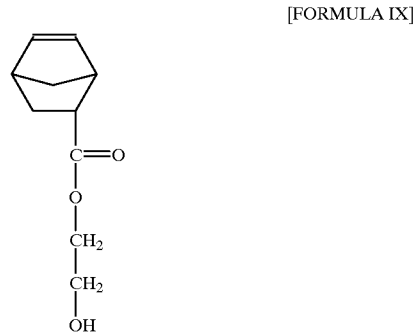

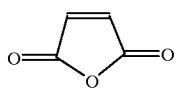

[FORMULA X]

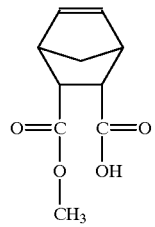

[FORMULA XI]

In the above formulas, R represents tert-butyl, 2-tetrahydropyranyl, 2-tetrahydrofuranyl or ethoxyethyl or like groups.

In the preparation of the copolymer resin according to the present invention, norbornene derivatives of formula VIII are preferably selected from the group consisting of tert-butyl 5-norbornene-2-carboxylate, 2-tetrahydropyranyl 5-norbornene-2-carboxylate, 2-tetrahydrofuranyl 5-norbornene-2-carboxylate and 2-ethoxyethyl 5-norbornene-2-carboxylate.

The copolymer resins according to the present invention can be prepared by a conventional polymerization process such as bulk polymerization or solution polymerization. As a solvent, cyclohexanone, methyl ethyl ketone, benzene, toluene, dioxane and/or dimethylformamide may be used individually, or in a mixture. Polymerization initiators usable in the present invention include benzoyl peroxide, 2,2'-azobisisobutyronitrile (AIBN), acetyl peroxide, lauryl peroxide, tert-butyl peracetate, di-tert-butyl peroxide, or the like.

In the process for preparing the copolymer resin according to the present invention, general polymerization conditions including temperature and pressure of radical polymerization may be controlled dependent upon the property of the reactants, but it is preferable to carry out the polymerization reaction at a temperature between 60 and 200° C.

The copolymer resin according to the present invention can be used in the formation of a positive micro-image by preparing a photoresist solution in which the resin is mixed with an organic solvent and a conventional photo acid generator according to a conventional process for preparing a photoresist composition. In the process for forming a photoresist pattern for a semiconductor element, the amount of the copolymer resin according to the present invention depends on the organic solvent or photo acid generator used, and the condition of lithography, but conventionally it is about 10 to 30% by weight on the basis of the organic solvent used in the preparation of the photoresist.

The process for forming a photoresist pattern for a semiconductor device by using the copolymer resin according to the present invention is described in detail here-in-below:

The copolymer resin according to the present invention is dissolved in cyclohexanone at a concentration of 10 to 30% by weight. A photo acid generator (0.1–10 wt %), such as triphenylsulfonium triflate, dibutylnaphthylsulfonium triflate, 2,6-dimethylphenylsulfonate, bis(arylsulfonyl)-diazomethane, oxime sulfonate or 2,1-diazonaphthoquinon-4-sultonate, is incorporated to the photoresist resin. The mixture is then filtered through an ultra-micro filter to prepare a photoresist solution. The photoresist solution is spin-coated on a silicon wafer to form a thin film, which is then soft-baked in an oven at 80–150° C. or on a hot plate for 1–5 minutes, exposed to light by using far ultraviolet exposer or an eximer laser exposer, and baked at a temperature between 100° C. and 200° C. for 10 seconds to 60 minutes. The exposed wafer is impregnated in 2.38% aqueous TMAH solution for 1 to 30 seconds to obtain a positive photoresist pattern.

A better understanding of the present invention may be obtained in light of following examples which are set forth to illustrate, but are not to be construed to limit, the present invention.

Preparation Example I

Synthesis of tert-butyl 5-norbornene-2-carboxylate

[FORMULA VIIIa]

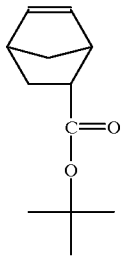

In a reactor, cyclopentadiene (66 g) and tetrahydrofuran solvent (500 g) were charged, and the mixture was stirred homogeneously. To the reaction mixture, tert-butyl acrylate (128 g) was added, and the resultant mixture was stirred at a temperature between −30° C. and 60° C. for about 10 hours to carry out the reaction. When the reaction was completed, the solvent was removed by using a rotary evaporator, and the residue was distilled under reduced pressure to obtain 176 g (yield: 90%) of tert-butyl 5-norbornene-2-carboxylate represented by chemical formula VIIa.

Preparation Example II

Synthesis of 2-hydroxyethyl 5-norbornene-2-carboxylate (formula IX)

The same procedure described in Preparation Example I was repeated but 2-hydroxyethyl acrylate (116 g) was used instead of tert-butyl acrylate to give 155 g (yield: 85%) of 2-hydroxyethyl 5-norbornene-2-carboxylate represented by the above-described formula IX.

Preparation Example III

Synthesis of 2-tetrahydropyranyl 5-norbornene-2-carboxylate

[FORMULA VIIIb]

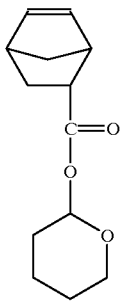

The same procedure described in Preparation Example I was repeated but 2-tetrahydropyranyl acrylate (156 g) was used instead of tert-butyl acrylate to give 186 g (yield: 84%) of 2-tetrahydropyranyl-5-norbornene-2-carboxylate represented by formula VIIIb.

Preparation Example IV

Synthesis of 2-tetrahydrofuranyl 5-norbornene-2-carboxylate

[FORMULA VIIIc]

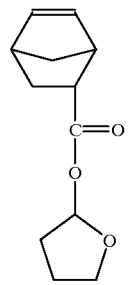

The same procedure described in Preparation Example I was repeated but 2-tetrahydrofuranyl acrylate (144 g) was used instead of tert-butyl acrylate to give 172 g (yield: 82%) of 2-tetrahydrofuranyl-5-norbornene-2-carboxylate represented by formula VIIIc.

Preparation Example V

Synthesis of 1-ethoxyethyl 5-norbornene-2-carboxylate

[FORMULA VIIId]

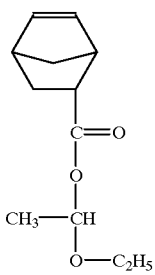

The same procedure described in Preparation Example I was repeated but ethoxyethyl acrylate (144 g) was used instead of tert-butyl acrylate to give 174 g (yield: 83%) of 1-ethoxyethyl-5-norbornene-2-carboxylate represented by formula VIIId.

Preparation Example VI

Synthesis of mono-methyl cis-5-norbornene-endo-2, 3-dicarboxylate (formula XI)

In a reactor, cyclopentadiene (66 g) was charged, and tetrahydrofuran solvent (500 g) and maleic anhydride (98 g) were added thereto, and the mixture was stirred homogeneously. To the reaction mixture, pure ethanol (500 g) was added and the reaction was carried out with stirring at 50° C. for 8 hours. when the reaction was completed, the solvent was removed by using a rotary evaporator, and the residue was distilled under reduced pressure to obtain 156 g (yield: 87%) of mono-methyl cis-5-norbornene-endo-2, 3-dicarboxylate represented by chemical formula XI.

EXAMPLE I

Synthesis of poly[tert-butyl 5-norbornene-2-carboxylate/2-hydroxyethyl 5-norbornene-2-carboxylate/mono-methyl cis-5-norbornene-endo-2, 3-dicarboxylate/maleic anhydride] copolymer resin (Formula IV)

In tetrahydrofuran or toluene, dissolved were maleic anhydride (1 mol), tert-butyl 5-norbornene-2-carboxylate (0.5–0.9 mol) prepared according to Preparation Example I, 2-hydroxyethyl 5-norbornene-2-carboxylate (0.05–0.8 mol) prepared according to Example II, and mono-methyl cis-5-norbornene-endo-2, 3-dicarboxylate (0.01–0.5 mol) prepared according to Preparation Example VI. then, 2,2'-azobisisobutyronitrile (AIBN) (0.5–10 g), as a polymerization initiator, was added thereto, and the reaction was performed at a temperature between 65° C. and 70° C. under nitrogen or argon atmosphere for 4–24 hours. Crude product thus obtained was precipitated from ethyl ether or hexane, and the precipitate was dried to give the title copolymer resin (Formula IV) having a molecular weight of 3,000–100,000 (yield: 63%). The copolymer resin thus prepared has high transparency to ArF light, increased etching resistance and excellent adhesiveness, and is developable by 2.38 wt % aqueous TMAH solution.

EXAMPLE II

Synthesis of poly[2-tetrahydropyranyl 5-norbornene-2-carboxylate/2-hydroxyethyl 5-norbornene-2-carboxylate/mono-methyl cis-5-norbornene-endo-2, 3-dicarboxylate/maleic anhydride] copolymer resin (Formula V)

The same procedure described in Example 1 was repeated but 2-tetrahydropyranyl 5-norbornene-2-carboxylate, prepared according to Preparation Example III was used instead of tert-butyl 5-norbornene-2 carboxylate, to obtain the title copolymer resin (formula V) having a molecular weight of 3,000–100,000 (yield: 68%). Though the protective group of the copolymer resin thus prepared was substituted by an acetal group, etching resistance of the resin did not deteriorate and the resin had excellent sensitivity (sensitivity: 11 Nj/cm$^2$).

EXAMPLE III

Synthesis of poly[2-tetrahydrofuranyl 5-norbornene-2-carboxylate/2-hydroxyethyl 5-norbornene-2-carboxylate/mono-methyl cis-5-norbornene-endo-2, 3-dicarboxylate/maleic anhydride] copolymer resin (Formula VI)

The same procedure described in Example 1 was repeated but 2-tetrahydrofuranyl 5-norbornene-2-carboxylate prepared according to Preparation Example IV was used instead of tert-butyl 5-norbornene-2-carboxylate, to obtain the title copolymer resin (formula VI) having a molecular weight of 4,000–100,000 (yield: 64%). the copolymer resin thus obtained had similar properties to that of Example II.

EXAMPLE IV

Synthesis of poly[1-ethoxyethyl 5-norbornene-2-carboxylate/2-hydroxyethyl 5-norbornene-2-carboxylate/mono-methyl cis-5-norbornene-endo-2, 3-dicarboxylate/maleic anhydride] copolymer resin (Formula VII)

The same procedure described in Example 1 was repeated but 1-ethoxyethyl 5-norbornene-2-carboxylate prepared according to Preparation Example V was used instead of tert-butyl 5-norbornene-2-carboxylate, to obtain the title copolymer resin (formula VII) having a molecular weight of 4,000–100,000 (yield: 59%). The copolymer resin thus obtained had similar properties to that of Example I, but had better properties in view of contrast.

EXAMPLE V

The copolymer resin (Formula IV) (10 g) obtained according to Example 1 was dissolved in 3-methoxymethyl propionate (40 g, solvent), and triphenylsulfonium triflate or dibutylnaphthylsulfonium triflate (about 0.2–1 g) as a photo acid generator, was added thereto. After stirring, the mixture was filtered through a 0.10 μm filter to give a photoresist solution. Then the photoresist solution was spin-coated on a surface of a wafer to prepare thin film having the thickness of 0.4–1.2 μm, and the wafer was soft-baked in an oven of 70–150° C. or on a hot plate for 1–5 minutes. After exposing to light of 250 nm wavelength by using an exposer, it was post-baked at 90–160° C. Then, the exposed wafer was dipped in an aqueous TMAH solution having a concentration of 0.01–5% by weight as a developing solution, for 1.5 minutes to obtain an ultra-micro photoresist pattern (resolution: 0.13 μm).

EXAMPLE VI

The same procedure described in Example V was repeated except using the copolymer resin (formula V) prepared according to Example II as a photoresist resin, to form an ultra-micro photoresist pattern.

EXAMPLE VII

The same procedure described in Example V was repeated except using the copolymer resin (formula VI) prepared according to Example III as a photoresist resin, to form an ultra-micro photoresist pattern.

EXAMPLE VIII

The same procedure described in Example V was repeated except using the copolymer resin (formula VII) prepared according to Example IV as a photoresist resin, to form a photoresist pattern.

In the case where a pattern is formed by using the photoresist described above, a semiconductor element having a micro-pattern of 0.13 μm can be manufactured, so that a highly integrated element can be advantageously obtained.

As described above, the copolymer resin for KrF (248 nm) or ArF (193 nm) photoresists according to the present invention is easily prepared by conventional radical polymerization due to the introduction of the mono-methyl cis-5-norbornene-endo-2, 3-dicarboxylate unit to the polymer structure. The resin has high transparency at 193 nm wavelength, provides increased etching resistance and settles the problem of offensive odor occurred in the course of copolymer resin synthesis. Further, as the resin composition can be easily controlled due to the molecular structure, the resin can be manufactured in a large scale. Thus, the copolymer resin for KrF or ArF according to the present invention can be usefully employed in lithography processes.

Many modifications and variations of the present invention are possible in light of the above teachings. Therefore, it is to be understood that within the scope of the appended claims, the invention may be practiced otherwise than as specifically described.

What is claimed is:

1. A copolymer resin of the formula:

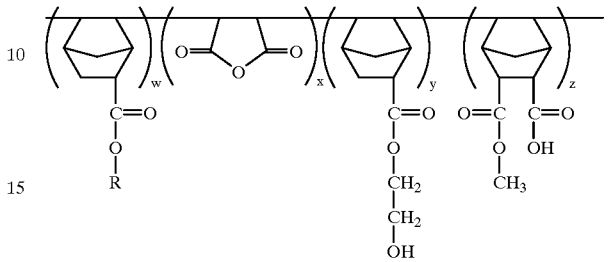

wherein
R is tert-butyl, tetrahydropyranyl, tetrahydrofuranyl or ethoxyethyl; and the ratio w:x:y:z is (0.1–99%):(0.1–99%):(0.1–99%):(0.1–99%).

2. A copolymer resin according to claim 1 of the formula:

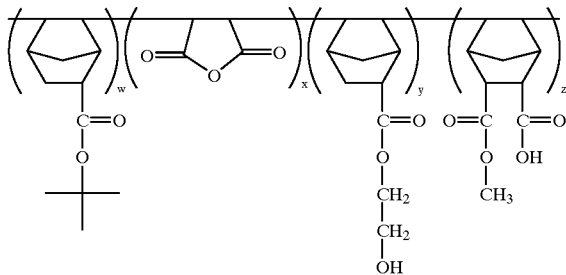

wherein w, x, y and z are those defined in claim 1.

3. A copolymer resin according to claim 1 of the formula:

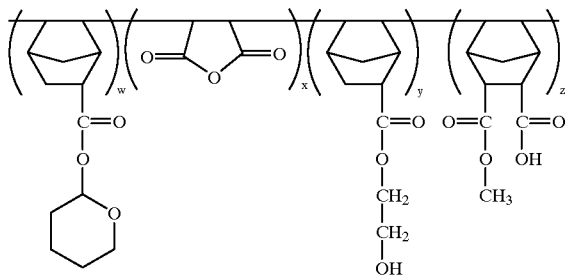

wherein w, x, y and z are those defined in claim 1.

4. A copolymer resin according to claim 1 of the formula:
5. A copolymer resin according to claim 1 of the formula:
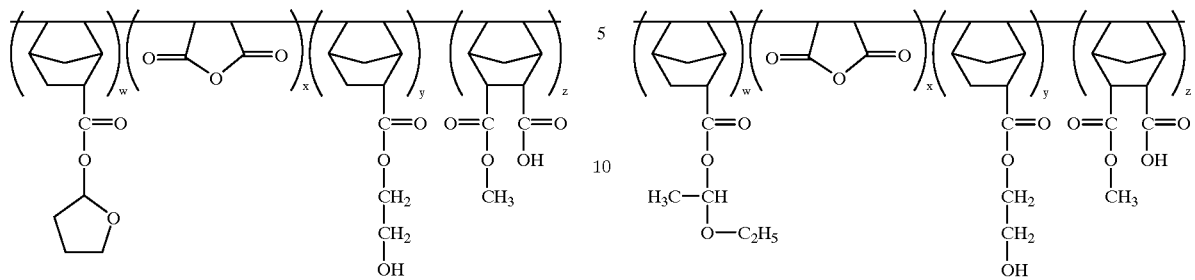
wherein w, x, y and z are those defined in claim 1.
wherein w, x, y and z are those defined in claim 1.
* * * * *